(12) United States Patent
Chi et al.

(10) Patent No.: US 7,465,885 B2
(45) Date of Patent: Dec. 16, 2008

(54) CIRCUIT CARRIER AND PACKAGE STRUCTURE THEREOF

(75) Inventors: Ming-Ren Chi, Hsin-Tien (TW); Wen-Sung Hsu, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 624 days.

(21) Appl. No.: 10/817,580

(22) Filed: Apr. 2, 2004

(65) Prior Publication Data

US 2005/0145412 A1 Jul. 7, 2005

(30) Foreign Application Priority Data

Jan. 7, 2004 (TW) .............................. 93100317 A

(51) Int. Cl.
*H05K 1/16* (2006.01)
(52) U.S. Cl. .................. 174/260; 174/52.2; 361/767
(58) Field of Classification Search .............. 174/260, 174/261, 52.2; 361/760, 763, 764, 767, 772, 361/774, 782, 783, 807, 808, 810, 811; 257/692
See application file for complete search history.

(56) References Cited

U.S. PATENT DOCUMENTS

| | | | | |
|---|---|---|---|---|
| 5,163,605 A | * | 11/1992 | Mencik et al. | 228/180.22 |
| 5,378,859 A | * | 1/1995 | Shirasaki et al. | 174/261 |
| 6,521,997 B1 | * | 2/2003 | Huang et al. | 257/737 |
| 6,673,690 B2 | * | 1/2004 | Chuang et al. | 438/382 |

* cited by examiner

*Primary Examiner*—Ishwar (I. B.) Patel
(74) *Attorney, Agent, or Firm*—J.C. Patents

(57) ABSTRACT

A circuit carrier is provided. The circuit carrier includes a substrate, a patterned circuit layer, and a solder mask layer. The patterned circuit layer is deposed on a surface of the substrate and has two passive component electrode pads. The solder mask layer covers the surface of the substrate, and includes a first solder mask opening, a second solder mask opening, and a third solder mask opening. The first solder mask opening and the second solder mask opening expose the passive component electrode pads respectively. The third solder mask opening along its length direction is divided into a central area and two extension areas. The central area is between the first and the second solder mask openings. The extension areas are extending from the central area along the length direction to two sides, respectively. The width of the central area is smaller than the width of one the extension areas.

16 Claims, 7 Drawing Sheets

CIRCUIT CARRIER AND PACKAGE STRUCTURE THEREOF

CROSS-REFERENCE TO RELATED APPLICATION

This application claims the priority benefit of Taiwan application serial no. 93100317, filed on Jan. 7, 2004, the full disclosure of which is incorporated herein by reference.

BACKGROUND OF THE INVENTION

1. Field of the Invention

This invention generally relates to a circuit carrier and a package structure thereof, and more particularly to a circuit carrier and a package structure thereof with passive components.

2. Description of Related Art

As the electronic technology advances, high technology industries have come out. Hence, more and more electronic products are developed and are inclined to compact designs. Currently, a circuit carrier, such as PCB or chip carrier, is a widely used component in circuit layout. A widely used circuit carrier is a lamination of a plurality of patterned circuit layers and a plurality of dielectric layers alternately. The dielectric layer is between two adjacent patterned circuit layers. The patterned circuit layers are electrically connected through the plated through hole (PTH) or via. Because the circuit carrier has the advantages of high layout density, compact assembly and good performance, it has been widely used in package structures. In addition, when the signals are transmitted between the circuit carriers, the passive components such as capacitors can be disposed on the circuit carrier to effectively refrain from the coupling inductance and to reduce the cross talk when the signals switch to different states, which maintain the signal transmission quality.

FIG. 1A is the top view of a conventional circuit carrier with electronic devices. Referring to FIG. 1A, the circuit carrier 100 includes a plurality of electronic devices 104 and 130 on the surface of a substrate 110. The device 104 for example is a chip, which is disposed on the die connecting area 104a of the substrate 110. The device 130 for example is a passive component such as capacitor, inductor, or resistor, which is disposed on the passive component connecting area 130a of the substrate 110.

FIG. 1B is the top view of the passive component connecting area of FIG. 1A. FIG. 1C is the cross-sectional view of the circuit carrier with the passive component along the I–I' line of FIG. 1A. In FIG. 1B, the passive component electrode pads 112 and 114 are disposed on the surface of the passive component connecting area 130a and consist of portions of the outermost patterned circuit layer (not shown), respectively. A solder mask layer 120 covers the surface of the substrate 110 and has a plurality of first solder mask openings 122a and 122b. The first solder mask openings 122a and 122b respectively expose a portion of the surface of the corresponding passive component electrode pads 112 and 114. The passive component electrode pads 112 and 114 can be used for the circuit carrier 100 to electrically connect electrodes of a passive component 130, respectively.

Referring to FIG. 1C, the passive component 130 includes a plurality of electrodes 132 and 134 whose surfaces are electrically and structurally connected to the passive component electrode pads 112 and 114 via the solders 124 and 126. Further, a flux can be used to enhance the connection between the solders 124 and 126 and the passive component electrode pads 112 and 114. In addition, after the passive component 130 is disposed on the circuit carrier 100, the remaining flux on the circuit carrier 100 can be removed by a cleaning step. Then an encapsulant 128 covers the surface of the passive component 130 to form a package structure 102.

In FIG. 1C, because the passive component 130 crosses over from the circuit carrier 110 to the passive component electrode pads 112 and 114, and the gap 108 between the passive component 130 and the solder mask layer 120 is very narrow, the remaining flux in the gap 108 between the passive component 130 and the solder mask layer 120 can not be effectively removed. In addition, the encapsulant 128 also cannot be filled into the gap 108. Hence, if a subsequent high temperature process such as reflow process is applied to the circuit carrier 100 with the passive component 130, the solders 124 and 126 may flow into the gap 109 (between the encapsulant 128 and the solder mask layer 120) below the passive component 130, which will short-circuit the passive component electrode pads 112 and 114 and make the passive component ineffective. This is so-called solder bridge issue or channel effect.

To resolve this problem, the conventional art forms a second solder mask opening with a long but narrow shape (not shown) on the solder mask layer 120 between the passive component electrode pads 112 and 114 to effectively remove the flux remaining between the passive component 130 and the solder mask layer 120, which further reduces the possibility that the solders 124 and 126 flow into the gap 109. In addition, because the second solder mask opening can increase the length of the gap 109 along the passive component electrode pads 112 and 114, it would make it more difficult to connect the solders 124 and 126 even if the solders 124 and 126 flow into the gap 109.

FIGS. 2A–2C show three conventional second solder mask openings. The shape of the conventional second solder mask opening can be rectangular, elliptic, or circular. In FIG. 2A, the length direction of the rectangular second solder mask opening 116a is substantially perpendicular to the line connecting the centers of the second mask openings 122a and 122b. The width d1 of the central area is the same as the widths d2 and d3 of the side areas along the length direction. Further, in FIGS. 2B and 2C, the max widths d4 and d7 of the central areas of the rectangular and elliptic second mask openings 116b and 116c are between the solder mask openings 122a and 122b. The widths of the side areas d5, d6, d8, and d9 decrease from the central area A to two sides. It should be noted that when the pitch D between the passive component electrode pads 112 and 114 tends toward the find pitch, the width of the central area A of the second solder mask openings 116b and 116C between the solder mask openings 122a and 122b has to be reduced. This will again cause the same problem that the remaining flux in the second solder mask opening 116b and 116c is difficult to be removed, and that the encapsulant 128 is difficult to fill into the second solder mask opening 116b and 116c. Therefore, a new solution is desired for the second solder mask openings 116b and 116c.

SUMMARY OF THE INVENTION

An object of the present invention is to provide a circuit carrier to reduce the channel effect generated after the passive component is soldered to the circuit carrier.

Another object of the present invention is to provide a package structure to reduce the channel effect generated after the passive component is soldered to the circuit carrier.

The present invention provides a circuit carrier comprising a substrate having a surface, the surface having a passive component connecting area; a patterned circuit layer on the surface of the substrate, the patterned circuit layer having at least a set of passive component electrode pads on the passive component connecting area, the set of passive component electrode pads including a first passive component electrode pad and a second passive component electrode pad; and a solder mask layer covering the surface of the substrate, the solder mask layer including at least a set of solder mask openings, the set of solder mask openings including a first solder mask opening, a second solder mask opening, and a third solder mask opening, the first solder mask opening and the second solder mask opening exposing the first passive component electrode pad and the second passive component electrode pad respectively, the third solder mask opening having a length direction, the third solder mask opening along the length direction being divided into a central area, a first extension area, and a second extension area, the central area being between the first and the second solder mask openings, the first extension area and the second extension area extending from the central area along the length direction to two sides respectively, the width of the central area being smaller than the width of the first extension area. Further, the present invention also provides a package structure with the above circuit carrier of the present invention. The package structure includes a passive component with electrodes wherein the electrodes are electrically connected to the passive component electrode pads, respectively.

In light of the above, because the central area width of the third solder mask opening of the present invention is relatively smaller than the width of the first extension area, after the electrodes of the passive component are soldered to the passive component electrode pads, the remaining flux between the passive component and the substrate can be easily removed and the encapsulant can be easily filled into the third solder mask opening. Therefore, the channel effect can be reduced and the yield rate will increase after the subsequent high temperature process.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE PREFERRED EMBODIMENTS

Figure 1A:
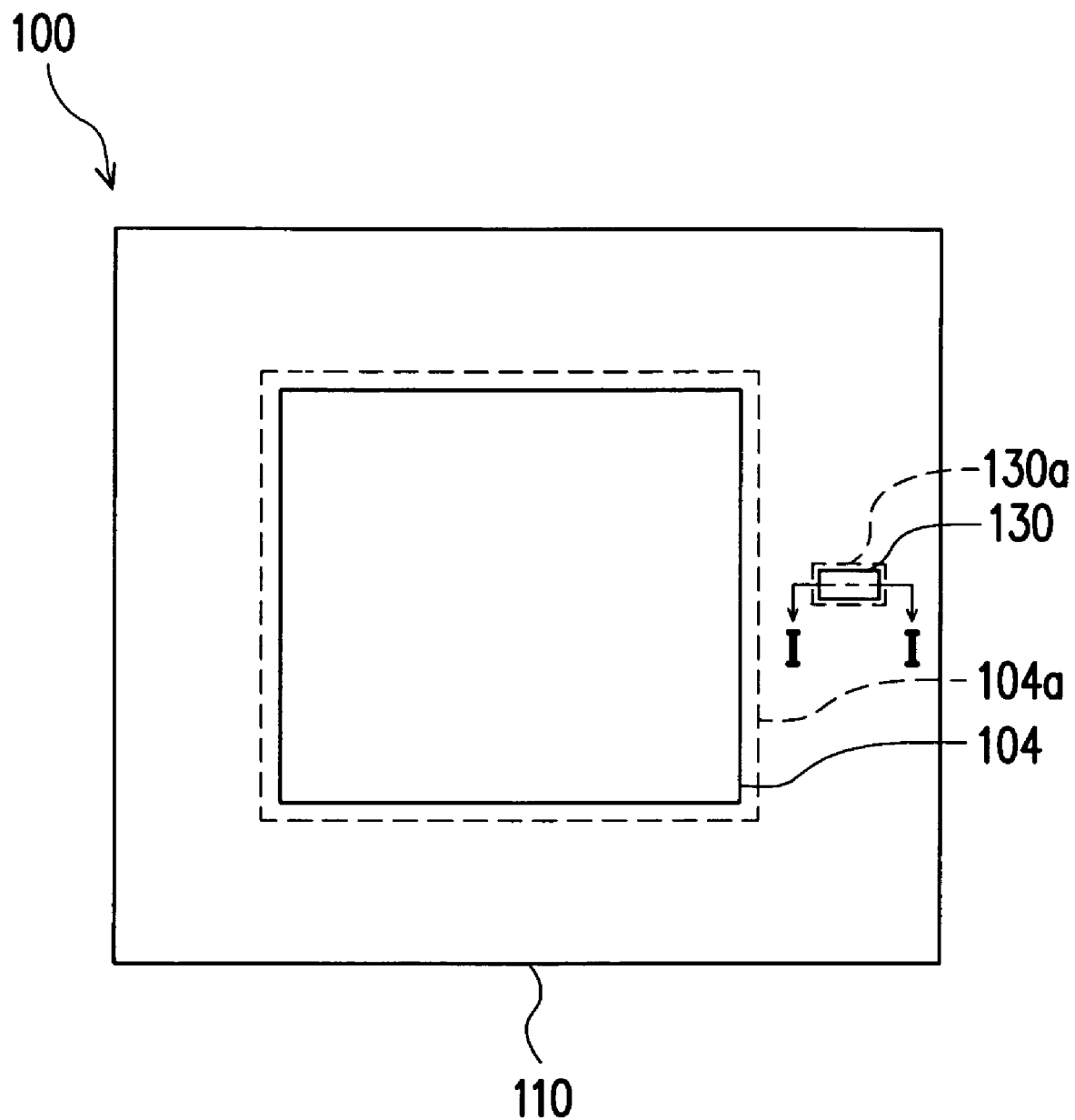
FIG. 1A is the top view of a conventional circuit carrier with electronic devices.
Figure 1B:
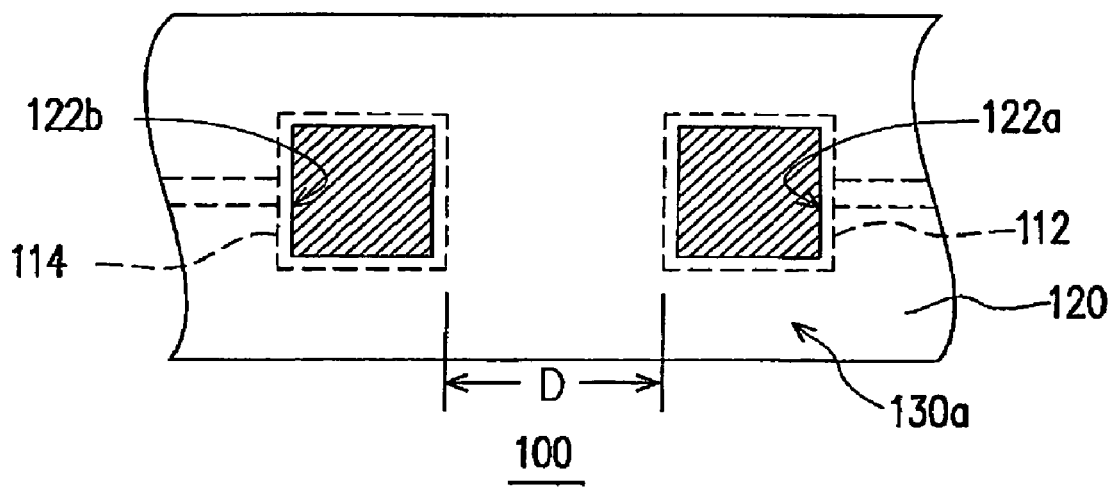
FIG. 1B is the top view of the passive component connecting area of FIG. 1A.
Figure 1C:
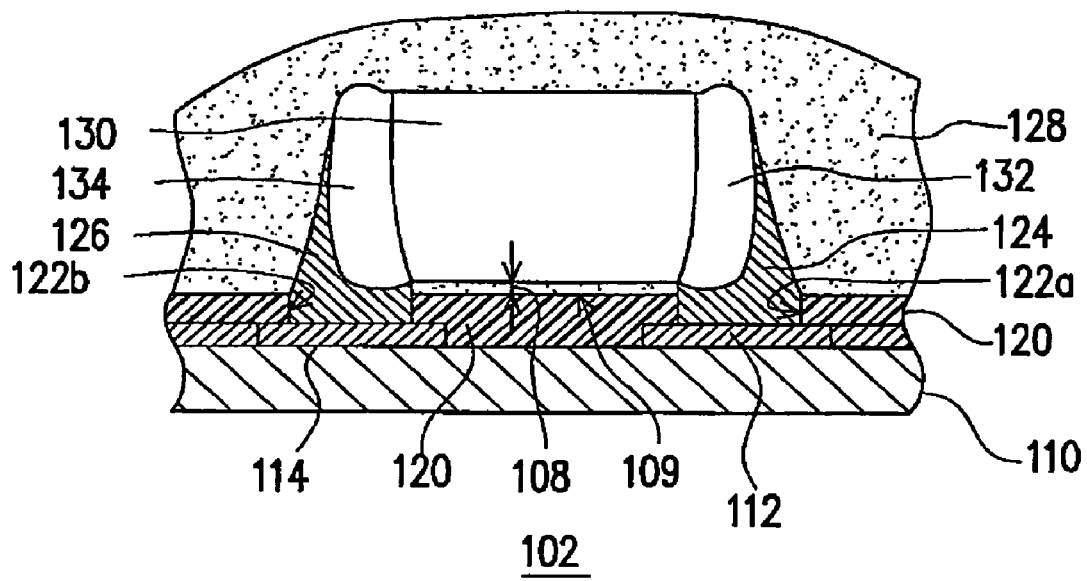
FIG. 1C is the cross-sectional view of the circuit carrier with the passive component along the I—I line of FIG. 1A.
Figure 2A:
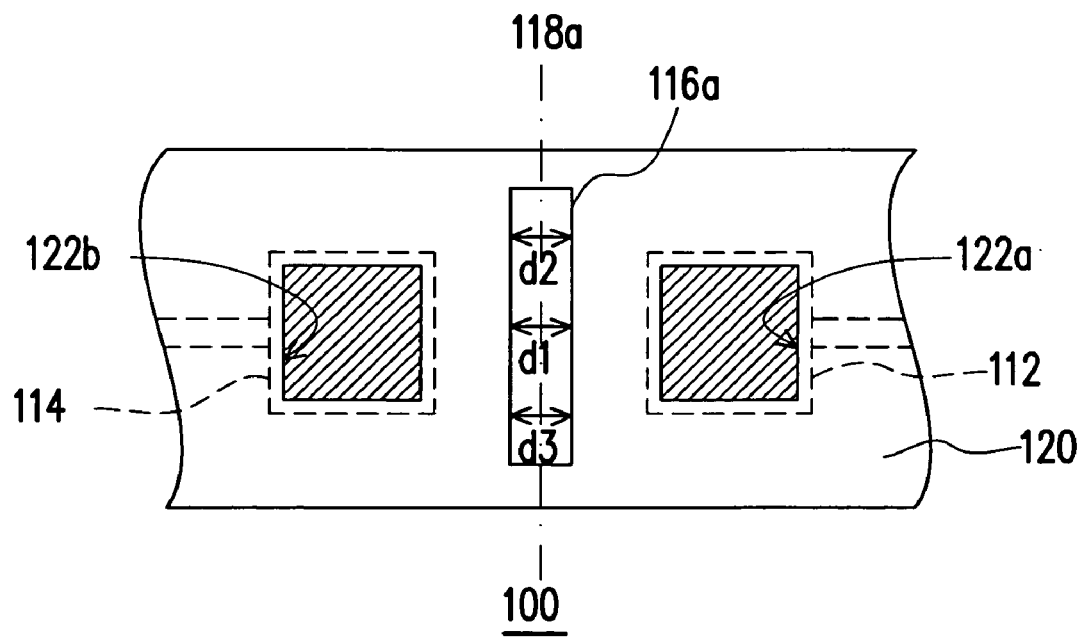
FIGS. 2A–2C show three conventional second solder mask openings.
Figure 2B:
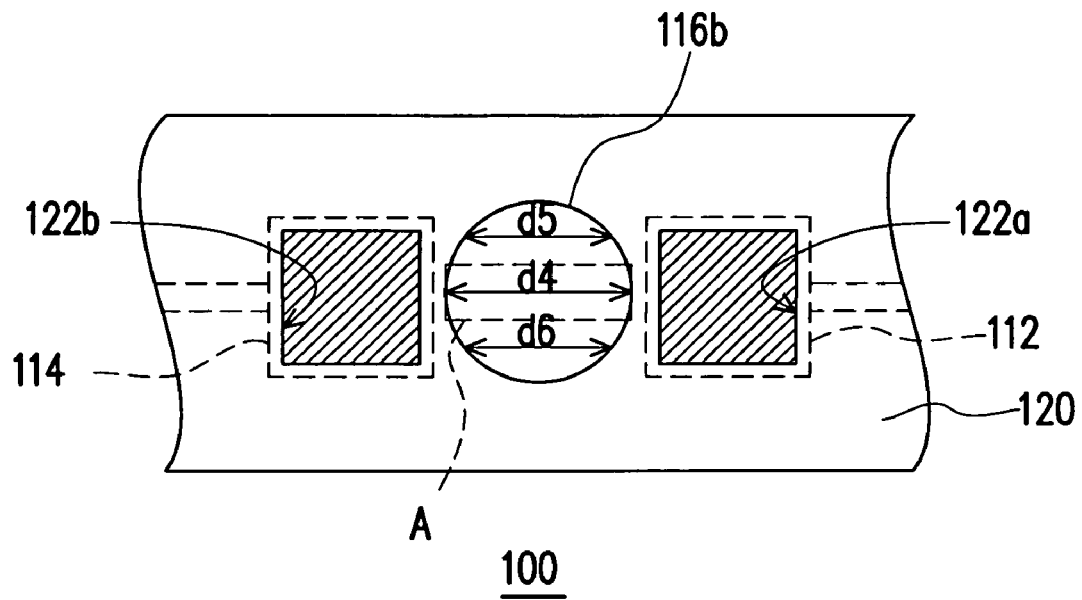
Figure 2C:
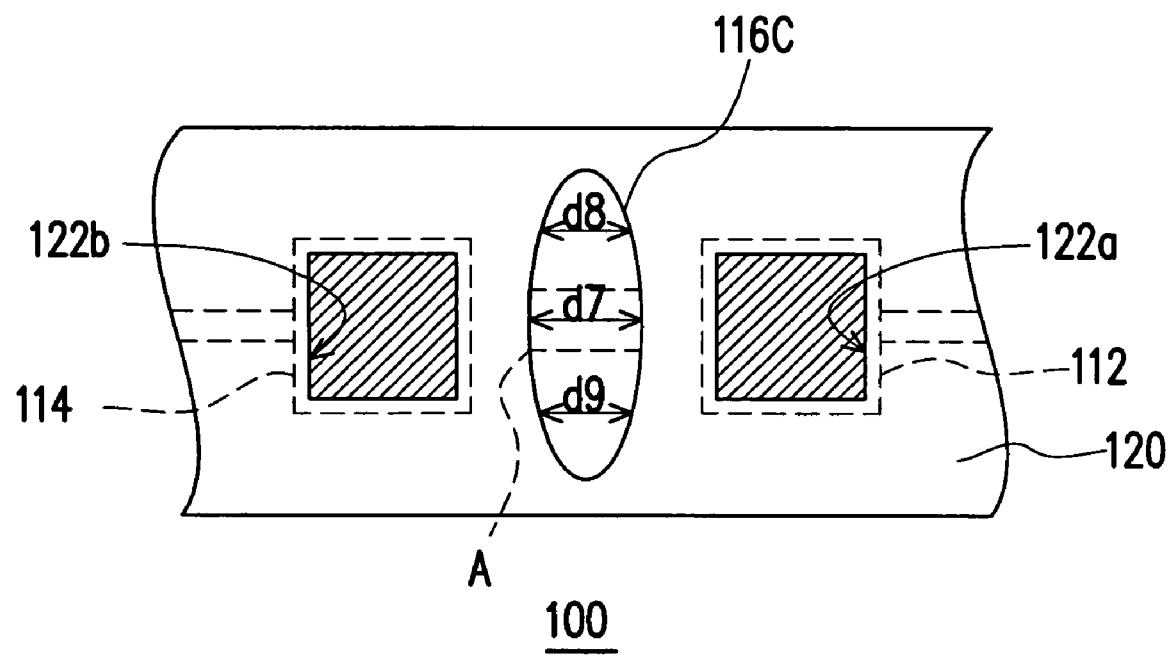
Figure 3A:
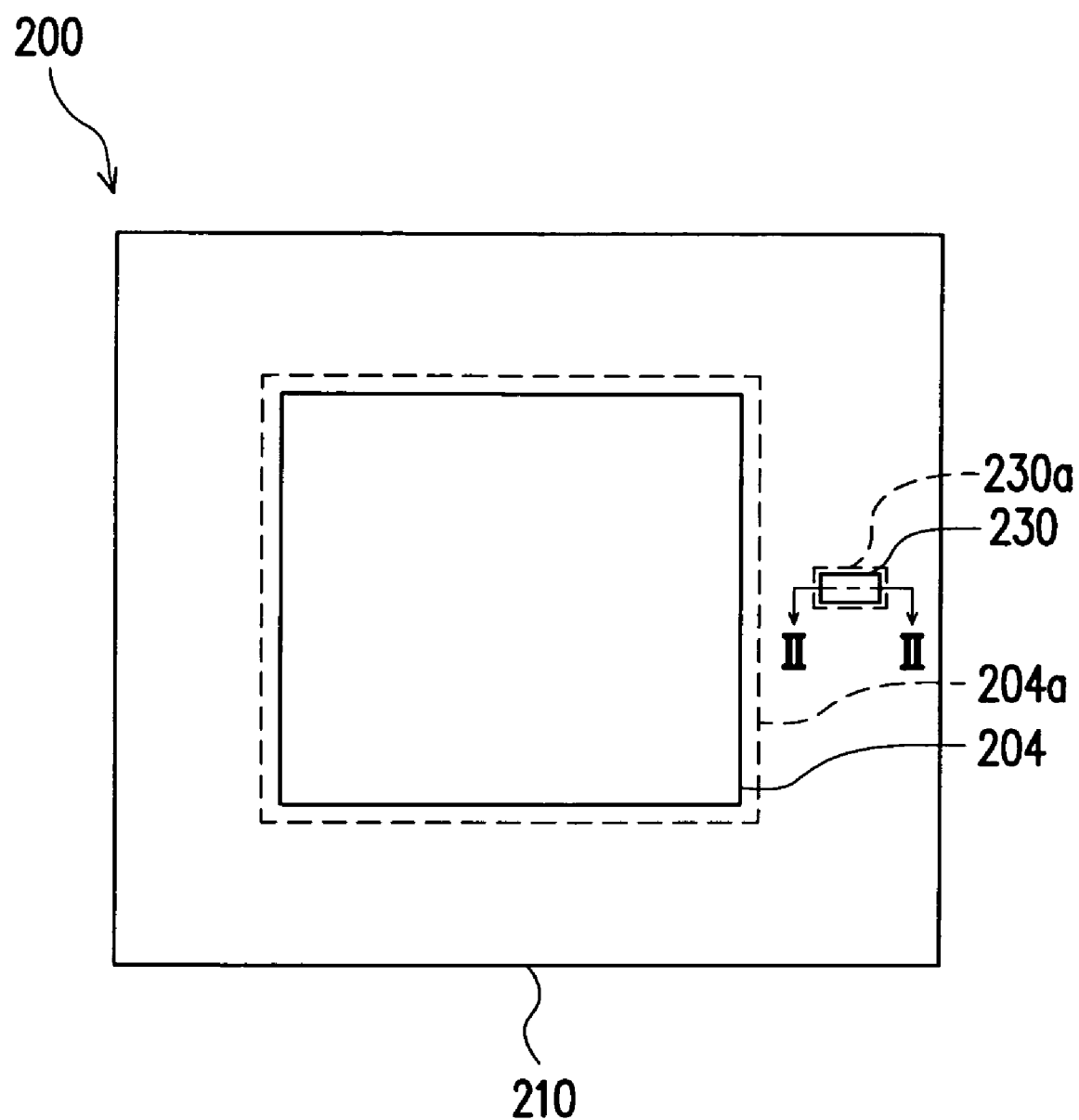
FIG. 3A is the top view of a circuit carrier with the electronic devices in accordance with the present invention.

FIG. 3A is the top view of a circuit carrier with the electronic devices in accordance with the present invention. Referring to FIG. 3A, the circuit carrier 200 includes a plurality of electronic devices 204 and 230 on the surface of a substrate 210. The device 204 for example is an active IC chip, which is disposed on the die connecting area 204a of the substrate 210. The device 230 for example is a passive component such as capacitor, inductor, or resistor, which is disposed on the passive component connecting area 230a of the substrate 210. In this embodiment, the passive component connecting area 230a and the die connecting area 204a are on the top surface of the substrate 210. The passive component connecting area 230a also can be on the bottom surface of the substrate 210 (not shown), and on the different surface from said die connecting area 204a. Further, the substrate 210 can include a plurality of passive components. In this embodiment, only one passive component 230 is used to illustrate the present invention. In addition, the active device 204 for example is electrically connected to the substrate 210 by wire bonding or by flip chip bonding.

Figure 3B:
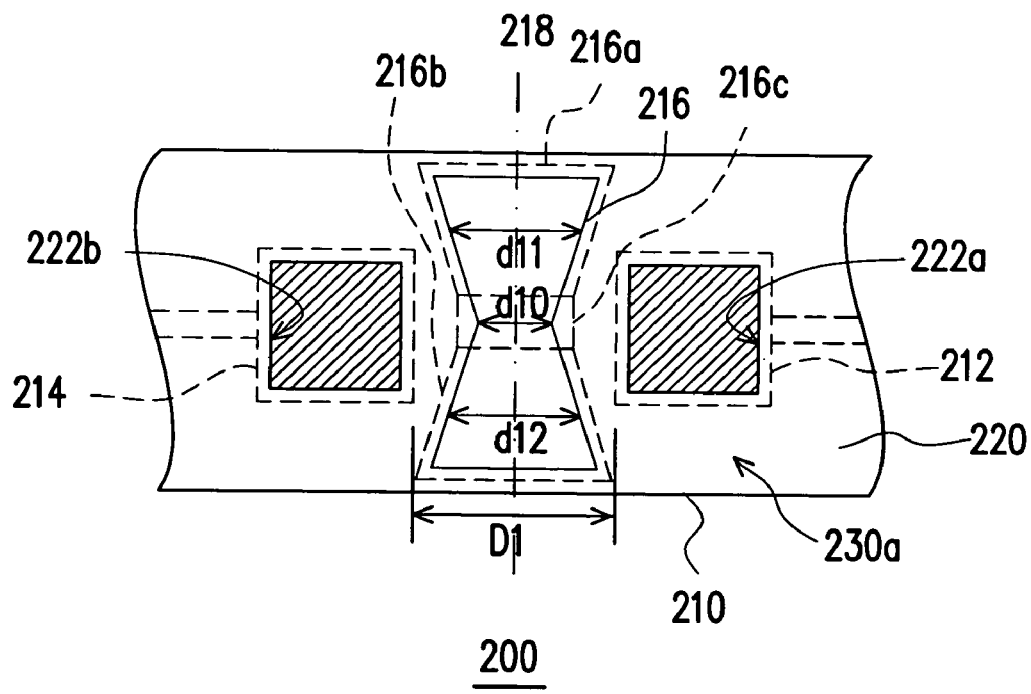
FIG. 3B is the top view of the passive component connection area of the circuit carrier in accordance with another preferred embodiment of the present invention.

FIG. 3B is the top view of the passive component connection area of the circuit carrier in accordance with another preferred embodiment of the present invention. The circuit carrier 200 includes a substrate 210, a first passive component electrode pad 212, a second passive component electrode pad 214, and a solder mask layer 220. The first and second passive component electrode pad 212 and 214 are disposed on the surface of the substrate 210 and are placed within the passive component connecting area 230a. The first and second passive component electrode pad 212 and 214 are formed by the outermost patterned circuit layer (not shown). Further, the solder mask layer 220 covers the surface of the substrate 210 and includes a first solder mask opening 222a and a second solder mask opening 222b. The first and second solder mask openings 222a and 222b respectively expose partially or wholly the surface of the corresponding passive component electrode pads 212 and 214.

Referring to FIG. 3B, it should be noted that the solder mask layer 220 further includes a third solder mask opening 216 with a length direction 218. The length direction 218 is substantially perpendicular to the line connecting the centers of the second mask openings 222a and 222b. In this embodiment, the third solder mask opening 216 along the length direction 218 is divided into a central area 216c, a first extension area 216a, and a second extension area 216b. The central area 216c is between the first and the second solder mask openings 222a and 222b. The first extension area and the second extension area 222a and 222b extend from the central area 216c along the length direction 218 to two sides of the central area 216c respectively. The width d10 of the central area 216c is smaller than the width d11 of the first extension area 222a. Because the width d10 can be reduced and the widths d11 and d12 of the first and the second solder mask openings 222a and 222b in two sides of the central area 216c can be increased, when the pitch D1 between the passive component electrode pads tends toward the fine pitch, the central area 216c of the third solder mask opening 216 can be accommodated between the first and the second solder mask openings 222a and 222b to prevent the channel effect.

Referring to FIG. 3B, the shape of the third solder mask opening 216 for example is a funnel shape. The widths d11 and d12 of the first and the second extension areas 216a and 216b increase gradually from the central area 216c along the length direction 218. Hence, the third solder mask opening 216 has the smallest width at the central area 216c, and has the largest width at the two sides of the central area 216c. The width of the third solder mask opening 216 is linearly increased from the central to the sides of the central area 216c. Of course the width of the third solder mask opening 216 can be nonlinearly increased from the central to the sides of the central area 216c. In this embodiment, the shape of the first and second extension areas 216a and 216b can be trapezoids. The shorter sides of the two trapezoids are connected to the two side of the central area 216c along the length direction 218, respectively.

Figure 3C:
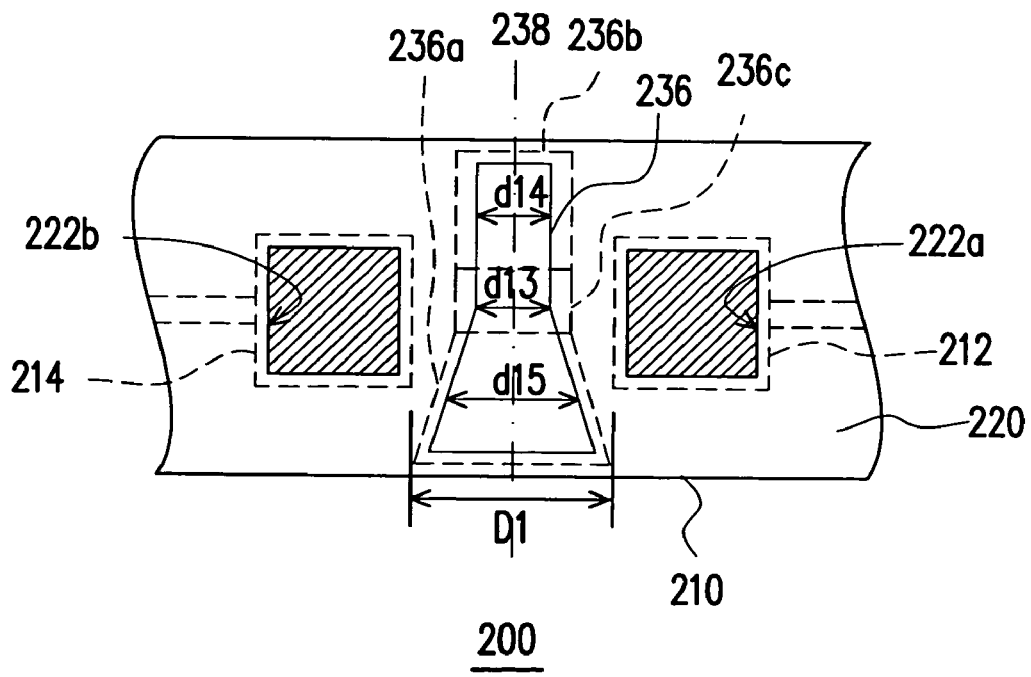
FIG. 3C is another solder mask opening in accordance with the present invention.

FIG. 3C is another solder mask opening in accordance with the present invention. In this embodiment, the third solder mask opening 236 has asymmetrical funnel shape. The width d15 of the first extension area 236a increases gradually along the length direction and the width d14 of the second extension 236b are the same as the width d13 of the central area 236c. Hence, the third solder mask opening 236 has the smallest width d13 at the central area 236c and has the largest width at the first extension area side farthest from the central area 236c. The width of the third solder mask opening 236 is linearly increased from the central area 236c to the first extension area 236a. Of course, the width of the third solder mask opening 236 can be nonlinearly increased from the central area 236c to the first extension area 236a. In this embodiment, the shape of the first extension area 236a is a trapezoid and the shape of the second extension area 236b is a rectangle. The shorter sides of the trapezoid and the rectangle are connected to the two side of the central area 236c along the length direction 238 respectively.

Figure 3D:
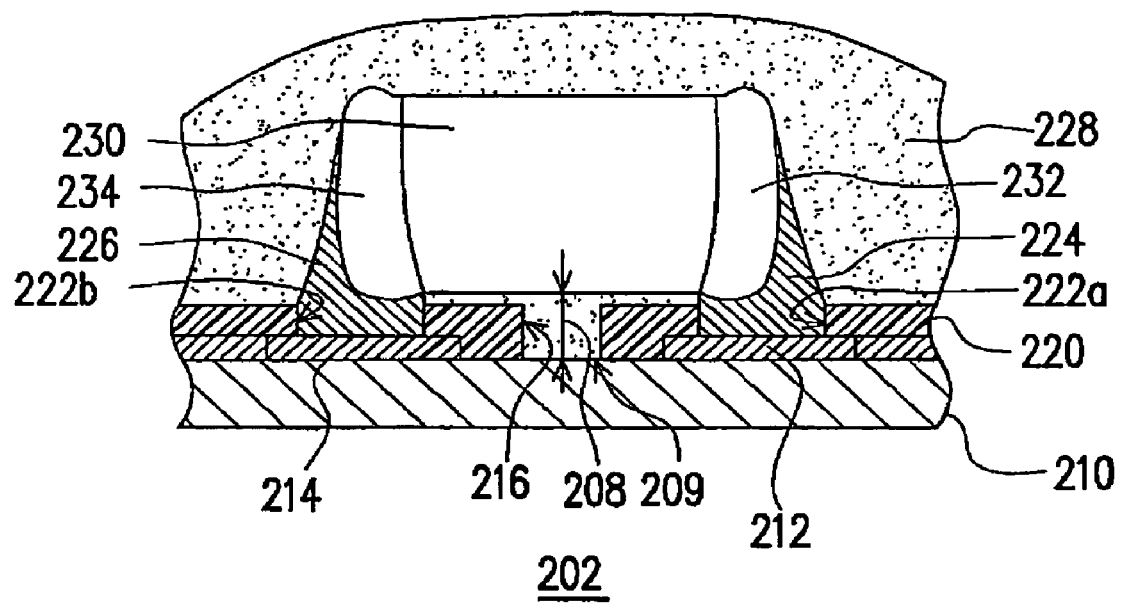
FIG. 3D is the cross-sectional view of the circuit carrier with the passive component along the II—II line of FIG. 3A.

FIG. 3D is the cross-sectional view of the circuit carrier with the passive component along the II—II line of FIG. 3A. In this embodiment, the circuit carrier 200 further includes a passive component 230 such as a capacitor, a resistor, or an inductor. The passive component 230 includes a first electrode 232 and a second electrode 234. The surfaces of the first and the second electrodes 232 and 234 are electrically and structurally connected to the corresponding passive component electrode pads 212 and 214 via the solders 224 and 226. Further, a flux can be used to enhance the connection between the solders 224 and 226 and the passive component electrode pads 212 and 214. In addition, after the passive component 230 is disposed on the circuit carrier 200, the remaining flux on the circuit carrier 200 can be removed by a cleaning step. Then an encapsulant 228 covers the surface of the active component 204 and/or the passive component 230 to form a package structure 202.

Referring to FIGS. 3B and 3D, it should be noted that the third solder mask opening 216 not only can widen the gap 208 between the passive component 208 and the substrate 210 to prevent the channel effect, but also can increase the yield rate of the circuit carrier because when removing the remaining flux in the third solder mask opening 216, because the width d10 of the central area 216c is smaller than the widths d11 and d12 of the first and second extension areas 216a and 216b at the two sides of the central area 216c, the cleaning liquid can more easily enter remove the remaining flux in the central area 216c of the third solder mask opening 216. Similarly, when the passive component 230 is soldered to the circuit carrier 200, the encapsulant 228 can more easily enter into the third solder mask opening 216 in order to increase the yield rate of the encapsulation process. In addition, during the subsequent high temperature process such as reflow process, because the third solder mask opening 216 increases the length of the gap 209 formed by the encapsulant 228 and the substrate 210, the solders 224 and 226 will be more difficult to enter into the gap 209, which prevents the passive component electrode pads 212 and 214 from short-circuit and increases the yield rate of the subsequent high temperature process.

In light of the above, the circuit carrier and the package structure thereof have the following advantages:

1. Because the width of the central area of the third solder mask opening can be reduced and the widths of the first and the second solder mask openings in two sides of the central area can be increased, when the pitch between the passive component electrode pads tends toward the fine pitch, the central area of the third solder mask opening can be accommodated between the first and the second solder mask openings to prevent the channel effect.

2. The cleaning liquid can more easily remove the flux remaining in the central area of the solder mask opening in order to increase the reliability of the circuit carrier.

3. During the encapsulation process, the encapsulant can more easily enter into the central area of the solder mask opening from the wider area of the opening, which increases the yield rate of the encapsulation process.

4. During the subsequent high temperature process such as reflow process, the solders will be more difficult to enter into the gap formed by the encapsulant and the substrate, which increases the yield rate of the subsequent high temperature process.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A circuit carrier, comprising
  a substrate having a surface, said surface having a passive component connecting area;
  a patterned circuit layer on said surface of said substrate, said patterned circuit layer having at least a set of passive component electrode pads on said passive component connecting area, said set of passive component electrode pads including a first passive component electrode pad and a second passive component electrode pad; and
  a solder mask layer covering said surface of said substrate, said solder mask layer including at least a set of solder mask openings, said set of solder mask openings including a first solder mask opening, a second solder mask opening, and a third solder mask opening, said first solder mask opening and said second solder mask opening exposing said first passive component electrode pad and said second passive component electrode pad respectively, said third solder mask opening having a length direction, said third solder mask opening along said length direction being divided into a central area, a first extension area, and a second extension area, said central area being between said first and said second solder mask openings, said first extension area and said second extension area extending from said central area along said length direction to two sides respectively, the width of said central area being smaller than the width of said first extension area.

2. The circuit carrier of claim 1, wherein said circuit carrier is an IC package substrate.

3. The circuit carrier of claim 1, wherein said surface of said circuit carrier includes a top surface and a bottom surface corresponding to said top surface.

4. The circuit carrier of claim 1, wherein the widths of said first and second extension areas increase gradually from said central area along said length direction.

5. The circuit cater of claim 4, wherein the shape of each said first and second extension areas is a trapezoid, and the shorter side of each of said trapezoid is connected to one side of said central area along said length direction.

6. The circuit carrier of claim 1, wherein the width of said first extension areas increases gradually from said central area along said length direction.

7. The circuit carrier of claim 6, wherein the shape of said first extension area is a trapezoid and the shape of said second extension is a rectangle, and the shorter side of said trapezoid and the shorter side of said rectangle are connected to two sides of said central area along said length direction, respectively.

8. A package structure, comprising
a circuit carrier, said circuit carrier including
a substrate having a surface, said surface having a passive component connecting area;
a patterned circuit layer on said surface of said substrate, said patterned circuit layer having at least a set of passive component electrode pads on said passive component connecting area, said set of passive component electrode pads including a first passive component electrode pad and a second passive component electrode pad; and
a solder mask layer covering said surface of said substrate, said solder mask layer including at least a set of solder mask openings, said set of solder mask openings including a first solder mask opening, a second solder mask opening, and a third solder mask opening, said first solder mask opening and said second solder mask opening exposing said first passive component electrode pad and said second passive component electrode pad respectively, said third solder mask opening having a length direction, said third solder mask opening along said length direction being divided into a central area, a first extension area, and a second extension area, said central area being between said first and said second solder mask openings, said first extension area and said second extension area extending from said central area along said length direction to two sides respectively, the width of said central area being smaller than the width of said first extension area; and
at least a passive component having a first electrode and a second electrode, said first electrode and said second electrode being soldered to said first passive component electrode pad and said second passive component electrode pad respectively.

9. The package structure of claim 8, further comprising an encapsulant covering said passive component.

10. The package structure of claim 8, wherein said circuit carrier is an IC package substrate.

11. The package structure of claim 8, wherein said surface of said circuit carrier includes a top surface and a bottom surface corresponding to said top surface.

12. The package structure of claim 8, wherein the widths of said first and second extension areas increase gradually from said central area along said length direction.

13. The package structure of claim 12, wherein the shape of each said first and second extension areas is a trapezoid, and the shorter side of each of said trapezoid is connected to one side of said central area along said length direction.

14. The package structure of claim 8, wherein the width of said first extension areas increases gradually from said central area along said length direction.

15. The package structure of claim 14, wherein the shape of said first extension area is a trapezoid and the shape of said second extension is a rectangle, and the shorter side of said trapezoid and the shorter side of said rectangle are connected to two sides of said central area along said length direction respectively.

16. The package structure of claim 8, wherein said passive component is a resistor, a capacitor, or an inductor.

* * * * *